United States Patent [19]

Ngu Tung

[11] 4,121,116
[45] Oct. 17, 1978

[54] COMPONENT FOR LOGIC CIRCUITS AND LOGIC CIRCUITS EQUIPPED WITH THIS COMPONENT

[75] Inventor: Pham Ngu Tung, Paris, France

[73] Assignee: Thomson-CSF, Paris, France

[21] Appl. No.: 770,309

[22] Filed: Feb. 22, 1977

[30] Foreign Application Priority Data

Feb. 27, 1976 [FR] France .................................. 76 05585

[51] Int. Cl.² ............................................ H03K 19/08
[52] U.S. Cl. ..................................... 307/213; 307/214; 307/280; 307/317 A
[58] Field of Search ............... 307/214, 213, 288, 313, 307/303, 280, 300, 317 A

[56] References Cited

U.S. PATENT DOCUMENTS

| 3,083,303 | 3/1963 | Knowles et al. ................. 307/280 X |
| 3,473,047 | 10/1969 | Bohn et al. ....................... 307/214 X |
| 3,508,081 | 4/1970 | Matsuda ........................... 307/288 X |
| 3,790,817 | 2/1974 | Dobkin .................................. 307/214 |
| 4,009,397 | 2/1977 | Mulder et al. .................... 307/214 X |

*Primary Examiner*—John S. Heyman
*Attorney, Agent, or Firm*—Cushman, Darby & Cushman

[57] ABSTRACT

A component for integrated logic circuits comprises two complementary transistors integrated on the same substrate. A Schottky diode is connected in parallel with the output electrode and prevents saturation of the output transistor when it is in the conductive state.

3 Claims, 3 Drawing Figures

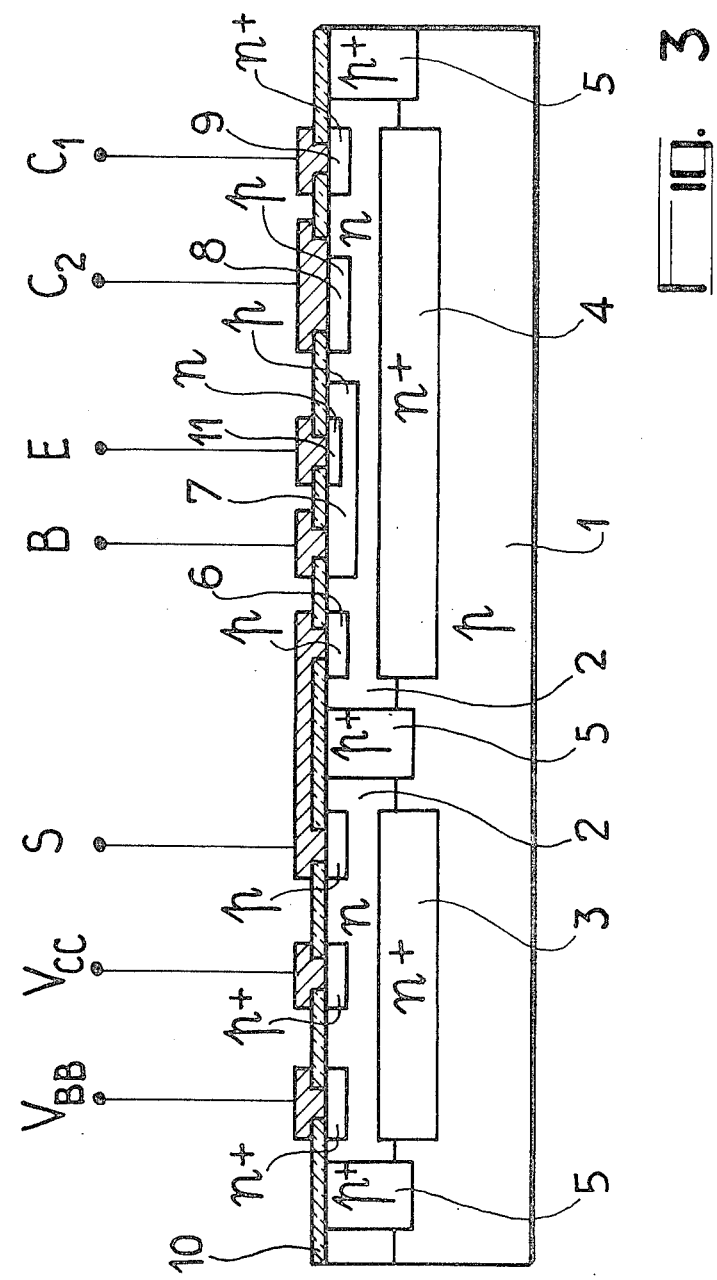

COMPONENT FOR LOGIC CIRCUITS AND LOGIC CIRCUITS EQUIPPED WITH THIS COMPONENT

This invention relates to a new component for logic circuits and to the circuits equipped with this component.

It is known that the qualities required of a component for logic circuits are, on the one hand, its energy consumption and, on the other hand, its switching speed from the conductive state to the blocked state and vice versa.

In the majority of circuits based on bipolar transistors, the transistors are close to saturation when they are conductive.

Their switching time from the conductive state to the blocked state is increased, because the minority electrical charges stored in certain regions of the structure take a certain time to disappear.

The component according to the invention essentially comprises two complementary pnp and npn transistors integrated on the same substrate; it is essentially distinguished by the fact that there is connected in parallel between the base of the second transistor and its collector a passive or active component which is the cause of a fall in potential lower than that caused by the corresponding semiconductive junction in the conductive state.

The invention will be better understood from the following description in conjunction with the accompanying drawings, wherein:

FIG. 1 shows the basic circuit of the component according to the invention;

FIG. 2 diagrammatically illustrates one embodiment of a logic inverter comprising an element according to the invention;

FIG. 3 is a cross-section through the logic inverter illustrated in FIG. 2 integrated on a single substrate.

The component according to the invention comprises two complementary npn and pnp transistors, namely the two transistors $T_1$ and $T_2$.

The emitter of the transistor $T_1$ is connected to ground terminal E, its base is connected to the p-type emitter of the transistor $T_2$ and its collector is connected to the n-type base of the transistor $T_2$. A Schottky diode DS is connected in parallel between the base of the transistor $T_2$ and its collector.

The base of the transistor $T_1$ and the emitter of the transistor $T_2$ are connected to a constant current supply which supplies a current I.

When the structure is conductive, the current I divides into two parts $I_1$ and $I_2$, with $I = I_1 + I_2$.

The current $I_1$ is injected into the base of the transistor $T_1$ and renders it conductive.

The result of this is that the collector of the transistor $T_1$ is connected to earth.

The same applies to the base of the transistor $T_2$. In this transistor, the p-n base-emitter junction is thus unblocked.

The potential of the emitter of this transistor is substantially equal to 0.7 volt.

Since the base of the transistor $T_2$ is connected to earth, this transistor is also unblocked and the Schottky diode is conductive. Now, it is known that when a Schottky diode is conductive, there is a potential difference of 0.3 volt, i.e. less than 0.7 volt, between its terminals.

The transistor $T_2$ is the seat of a current $I_2$ of which the object is to accelerate the desaturation of the transistor $T_1$. Since the sum $I = I_1 + I_2$ is constant, if $I_1$ increases, $I_2$ decreases and vice versa.

Figure 1:
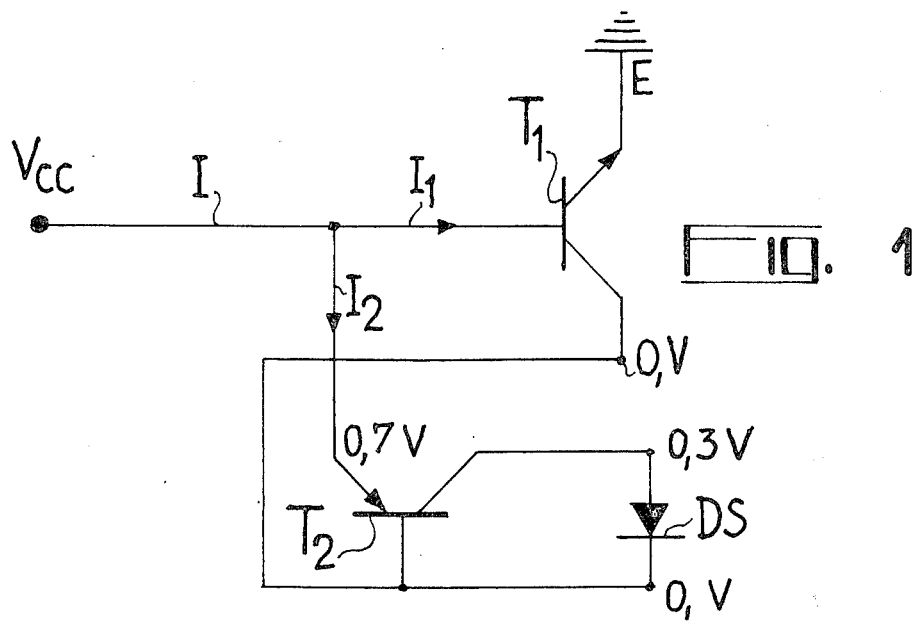
FIG. 1 is the basic circuit diagram of the component according to the invention.
Figure 2:
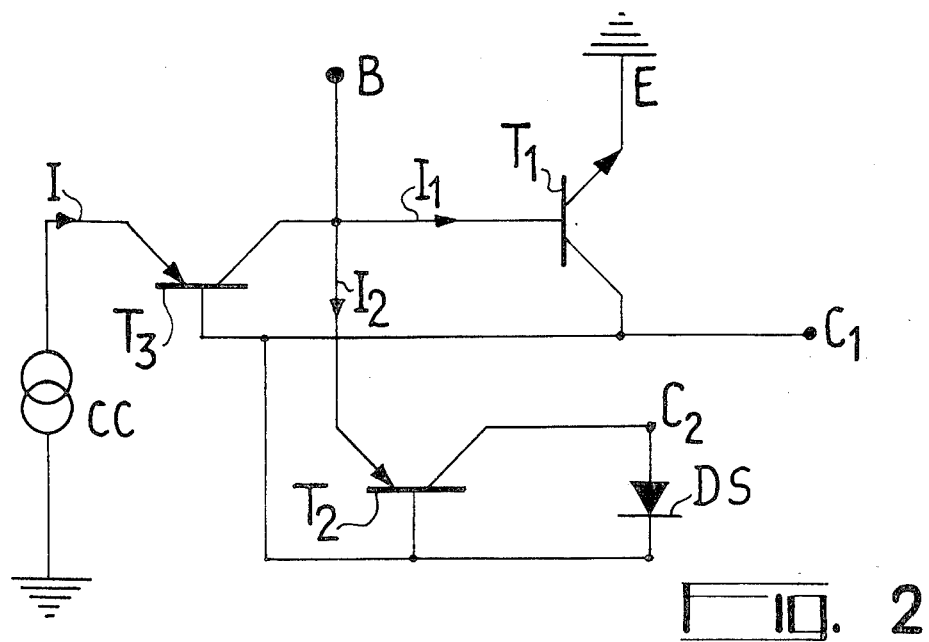

A structure such as this may be used in the inverter illustrated in FIG. 2.

FIG. 2 again shows the two transistors $T_1$ and $T_2$ and the Schottky diode DS connected in the same way as in the preceding Figures.

The base of the transistor $T_1$ is connected to the input B of the structure. The constant current source CC is connected to the point B through a transistor $T_3$ of which the p-type emitter is connected to one terminal of this source, its base to the base of the transistor $T_2$ and its collector to the point B, i.e. to the base of the transistor $T_1$.

The current arriving at the point I is $\alpha I$, $\alpha$ being the gain of the transistor $T_3$.

If the point B is at a voltage level termed voltage "1", for example 0.7 volt, the transistor $T_1$ is conductive. Its collector is connected to earth as is the base of the transistor $T_2$.

There are two possible outputs, the output $C_1$ on the collector of the transistor $T_1$, which is then at the level "0" (earth potential). Since the Schottky diode is then also conductive, the collector of the transistor $T_2$ will be at 0.3 volt, i.e. the output $C_2$.

If B, state "0", is at the potential or below the potential of 0.3 volt, the transistor $T_1$ is blocked by its base. $C_1$ is disconnected from earth and is at the potential of the base of the transistor $T_3$. Since this transistor $T_3$ is unblocked, its base is at the potential of 0.7 volt. This corresponds to the state "1" of the output $C_1$. The output $C_2$ will also be at the potential of 0.7 volt due to the blocking of the transistor $T_2$ of which the base will be at 0.7 volt because it is connected to the base of the transistor $T_3$ which is conductive.

FIG. 3 shows how the structure illustrated in FIG. 2 may be integrated on one and the same substrate.

The structure is integrated on a p-type substrate 1. An n-type layer 2 has been deposited onto this substrate for example by epitaxial growth. Two n+-type buried layers 3 and 4 have been diffused by known means at the interface of the two n-type and p-type layers 1 and 2. Finally, three p+-type insulating pits 5 have been diffused from the free surface of the n-type layer 2 to the layer 1 so as to form two compartments insulated from one another in the structure.

The whole has been covered with a layer of oxide for example by oxidation "in situ". If the substrate is of silicon, the layer may be a layer 10 of the oxide $SiO_2$, i.e. silica. The left-hand compartment contains the elements enabling the constant current source to be formed. The right-hand compartment contains the component according to the invention.

It is this latter structure which will be described first. Three regions 6, 7, 8 and 9, respectively of p-type conductivity (regions 6, 7 and 8) and of n+-type conductivity (region 9), are diffused or implanted in this compartment.

In the layer of silica 10, which can have been deposited after the operations of diffusion or implantation, there have been opened the contact S on the layer 6, the contact B on the layer 7, the contact $C_2$ on the layer 8 and on the layer 2 and the contact $C_1$ on the layer 9.

In the p-type layer 7, there has been implanted or diffused an n-type region 11 in which a contact E has been opened. The layer 11 again contains the emitter of the transistor $T_1$, the layer 7 its base and the layer 9 its collector with one of the output contacts $C_1$ on the system.

The contact $C_2$ on the layers 8 and 2 is the Schottky contact of FIG. 2.

The structure is therefore very easy to integrate and has low speed and consumption.

What I claim is:

1. A solid state component for logic circuit comprising integrated upon one and the same substrate, in combination, a first, a second, a third and a fourth semiconductive layer forming three rectifying junctions, and a first and a second complementary transistor having respective emitters, bases and collectors, said first layer being the emitter of said first transistor, said second layer, the base of said first transistor and the emitter of said second transistor, the third layer being the collector of said first transistor and the base of said second transistor, the fourth layer being the collector of said second transistor, said first layer being connected to ground, said second layer being adapted for connection to a constant d.c. current source, a rectifying element connected in parallel with said third and said fourth layers, said third layer being connected to ground when said first transistor is conductive, and the voltage drop across said rectifying element when unblocked being predetermined and lower than the voltage drop across said third and fourth layer when the junction formed therebetween is unblocked.

2. A component as claimed in claim 1 wherein in the first transistor, the current flows laterally and in the second transistor transversely.

3. A component as claimed in claim 1, wherein said constant d.c. current source comprises a third transistor having a base connected to said third layer, and a collector connected to said second layer.

* * * * *